United States Patent [19]

Mogi et al.

[11] 4,130,804
[45] Dec. 19, 1978

[54] CHANNEL SELECTING APPARATUS WITH LINEARIZED TUNING

[75] Inventors: Takao Mogi, Tokyo; Hisao Okada, Yokohama, both of Japan

[73] Assignee: Sony Corporation, Tokyo, Japan

[21] Appl. No.: 716,654

[22] Filed: Aug. 23, 1976

[30] Foreign Application Priority Data

Aug. 28, 1975 [JP] Japan ................................. 50-104444

[51] Int. Cl.$^2$ ............................................. H04B 1/06
[52] U.S. Cl. .................................... 325/464; 325/468
[58] Field of Search ............... 325/452, 453, 457, 459, 325/464, 465, 468, 470; 334/14–16; 358/191, 193; 340/347 AD; 331/1 A, 4

[56] References Cited

U.S. PATENT DOCUMENTS

| | | | |
|---|---|---|---|
| 3,594,765 | 7/1971 | Lerouge | 340/347 AD |
| 3,803,494 | 4/1974 | Howell et al. | 325/459 |
| 3,940,702 | 2/1976 | Yoshimura et al. | 325/464 |
| 3,953,801 | 4/1976 | Podowski | 325/464 |
| 3,965,336 | 6/1976 | Grohmann | 325/470 |
| 3,968,440 | 7/1976 | Ehni | 325/464 |

*Primary Examiner*—Robert L. Richardson
*Assistant Examiner*—Jin F. Ng
*Attorney, Agent, or Firm*—Lewis H. Eslinger; Alvin Sinderbrand

[57] ABSTRACT

In a channel selecting apparatus for a television receiver having a tuner with a voltage-controlled, variable reactance device as its tuning element, and in which such tuning element has a non-linear relation between its control voltage and the resulting receiving frequency; a sweep pulse generator is operable for producing sweep pulses, a counter counts the sweep pulses for producing progressively changing binary codes corresponding to the changing counts of the counter and which represent respective control voltages for the variable reactance device, a digital-to-analog converter receives the binary codes and converts the same into the respective control voltages for the variable reactance device, and a circuit is provided for varying the period of the sweep pulses so that the rate of change of the receiving frequency is substantially uniform over the range of the progressively changing binary codes. Such circuit for varying the period of the sweep pulses is preferably operable by the binary codes so as to respond to the changes in the latter.

12 Claims, 18 Drawing Figures

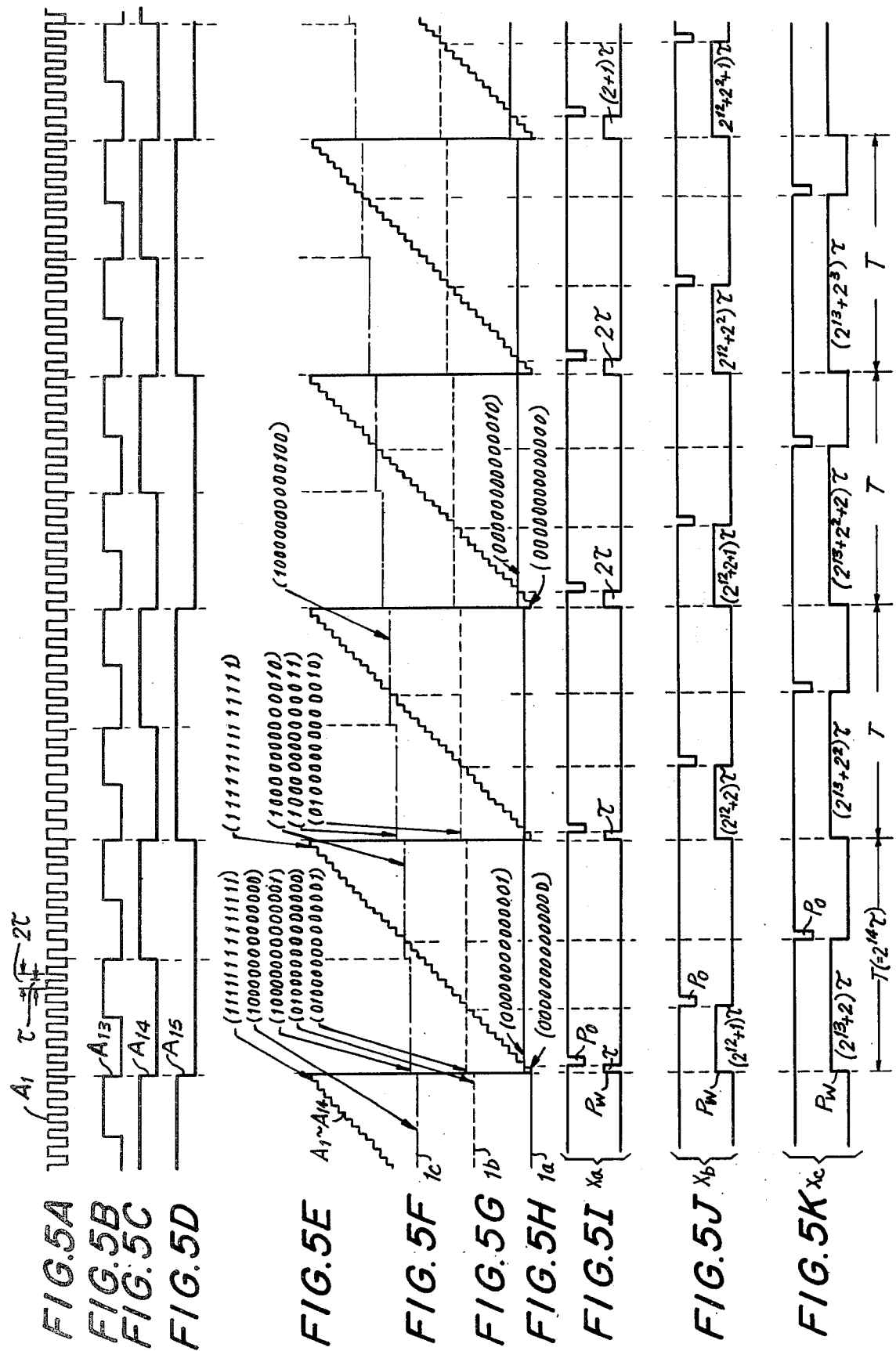

CHANNEL SELECTING APPARATUS WITH LINEARIZED TUNING

BACKGROUND OF THE INVENTION

1. Field of the Invention

This invention relates generally to channel selecting apparatus for a television receiver, and more particularly is directed to a channel selecting apparatus for a television receiver having a so-called electronic tuner employing, as its tuning element, a varactor or voltage-controlled, variable reactance device, such as, a variable capacitance diode.

2. Description of the Prior Art

Most existing television receivers employ electromechanical tuners in which a channel-selecting knob is manually rotatable through various positions established by a detent mechanism and which respectively correspond to the twelve vhf channels. At each of such positions of the knob, suitable switch contacts are engaged to activate a respective circuit by which the receiving frequency for the designated channel is obtained. Such electro-mechanical tuners are susceptible to failure because of loose or dirty switch contacts and defects in the detent mechanism. Furthermore, electromechanical tuners of the described type become extremely complex and even more unreliable when designed to tune the uhf channels in addition to the vhf channels.

In order to overcome the above problems of electro-mechanical tuners, so-called electronic tuners have been proposed for television receivers. In these proposed electronic tuners, a varactor, that is, an analog voltage-controlled, variable reactance device, such as, a variable capacitance diode, is employed as the tuning element, and the control voltage therefor is obtained either by means of a potentiometer array or a phase-locked loop arrangement. In the case of the potentiometer array, a number of potentiometers are connected between a stable voltage supply and ground, and each potentiometer is adjusted to provide a voltage which, when applied to the varactor by way of a respective solid state switch, will tune the receiver to a respective one of the local channels. Further, manually operable switches are provided to control the solid state switches associated with the several potentiometers. In the foregoing arrangement, it is difficult and costly to obtain stable potentiometers, and rather elaborate mechanical assemblies are required to provide for the adjustment of the several potentiometers so as to correspond to respective local channels.

In the existing electronic tuners employing a varactor with a phase-locked loop, the variable frequency output of the varactor controlled tuner is applied through an amplifier to a prescaler which divides such output frequency by a fixed number, and the resulting divided frequency is then further divided, in a variable counter or divider, by a number that is determined by a preset logic controlled by manually operable channel-selector switches. The output of the variable counter or divider is then compared, in a phase comparator, with a stable reference frequency obtained, for example, from a crystal-controlled oscillator, with the resulting error signal being used to control or vary the control voltage for the varactor. The foregoing phase-locked loop arrangement is disadvantageous in that the amplifier used to raise the low level of the output of the tuner for driving the digital prescaler may be costly, and further in that such prescaler has to operate at an undesirably high input frequency.

The present inventors have developed a channel selecting apparatus for a television receiver having a tuner with a voltage-controlled variable reactance device as its tuning element and which avoids the above described problems, for example, as disclosed in U.S. Patent application Ser. No. 716,702, filed Aug. 23, 1976, now U.S. Pat. No. 4,085,372. In such channel selecting apparatus, digital or binary codes representing or identifying respective channels are stored at respective addresses in a memory, and a digital-to-analog converter provides an analog control voltage for the variable reactance device in correspondence to each digital code selectively read out of the memory in a channel selecting mode of the apparatus. Further, in a programming mode of the apparatus, the changing digitally coded counts of a counter which is counting sweep pulses are applied to the digital-to-analog converter for similarly controlling the variable reactance device and selected counts of the counter, for example, those which result in the appearance on the receiver screen of pictures or test patterns broadcast by selected television stations or channels, are written at selected addresses in the memory as the channel identifying codes. However, since the variable reactance device employed as a tuning element has a non-linear relation between the control voltage for the variable reactance device and the resulting receiving frequency, in the programming mode of the apparatus there is a non-uniform rate of change of the receiving frequency over the range of the progressively changing binary codes obtained from the counter in response to the counting by the latter of the sweep pulses. Therefore, in the programming mode, a longer period of time may be required for changing from one to the other of the binary codes corresponding to next adjacent channels at the upper portion of the range of receiving frequencies than is required for next adjacent channels at the lower portion of such range of receiving frequencies.

OBJECTS AND SUMMARY OF THE INVENTION

Accordingly, it is an object of this invention to provide an improved channel selecting apparatus for a television receiver having a tuner with a varactor or voltage-controlled variable reactance device as its tuning element, and in which the above described problems and disadvantages of the previously proposed channel selecting apparatus for electronic tuners are avoided.

More particularly, it is an object of this invention to provide a channel selecting apparatus, as aforesaid, which can be easily and inexpensively formed as an integrated circuit, and which is capable of tuning the associated television receiver to any desired channel with very high accuracy and reliability.

Another object is to provide a channel selecting apparatus, as aforesaid, which is devoid of any potentiometers or variable resistors for establishing the control voltage of the varactor, thereby to avoid the problems that may arise from the high contact resistance or changes in the resistance value of potentiometers that can occur due to vibration, temperature variations or simply with time.

Still another object is to provide a channel selecting apparatus, as aforesaid, which may be very simply and quickly preset or programmed for determining the local channels that are to be received.

A further object is to provide a channel selecting apparatus, as aforesaid, which is of the type having a generator for sweep pulses which are counted to provide progressively changing binary codes applied to a digital-to-analog converter for providing corresponding control voltage for the variable reactance device, and in which the usual non-linear relation between the control voltage for the variable reactance device and the resulting receiving frequency is compensated so that the rate of change of such receiving frequency will be substantially uniform over the range of the progressively changing binary codes.

In accordance with an aspect of this invention, such compensation for the non-linear relation between the control voltage for the variable reactance device and the resulting receiving frequency is achieved by varying the period of the sweep pulses which are counted. Preferably, changes in the period of the sweep pulses are effected automatically in response to changes in the binary codes from the counter.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIGS. 5A-5K are waveform diagrams to which reference will be made in explaining the operation of the apparatus shown on FIG. 1.

DESCRIPTION OF A PREFERRED EMBODIMENT

Figure 1:
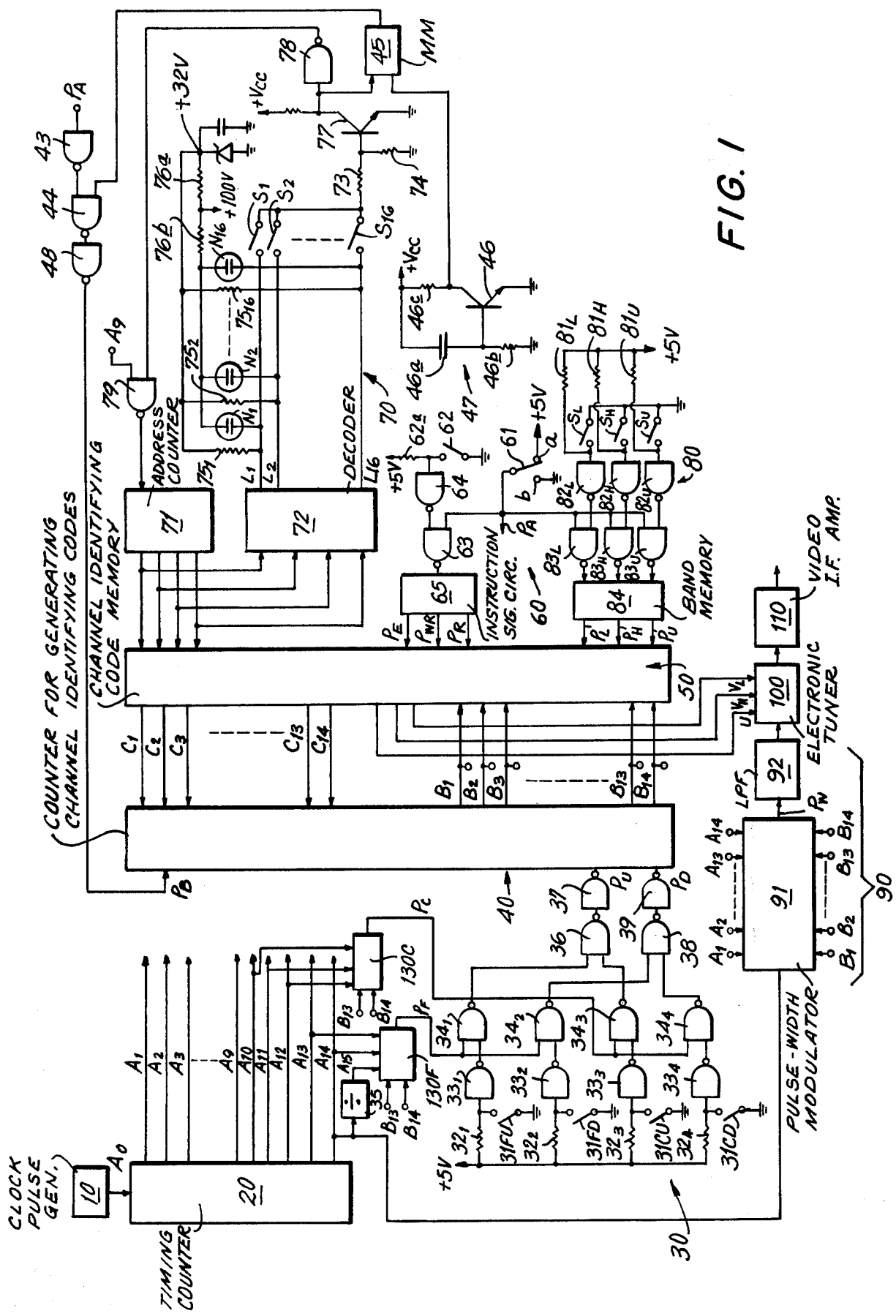
FIG. 1 is a block diagram illustrating a channel selecting apparatus according to an embodiment of this invention.

Referring to the drawings in detail, and initially to FIG. 1 thereof, it will be seen that a channel selecting apparatus according to this invention is there illustrated to generally comprise a generator 10 of a clock pulse $A_o$ which is applied to a timing counter 20 for producing a circulating digital or binary code $A_1, A_2, A_3 \cdots A_{14}$; a sweep pulse generating circuit 30 which is manually controllable to selectively produce up-sweep pulses $P_U$ or down-sweep pulses $P_D$; and an up-down counter 40 which, in a programming mode of the apparatus, counts the sweep pulses $P_U$ or $P_D$ to establish channel identifying digital or binary codes $B_1, B_2, B_3 \cdots B_{14}$ corresponding to the changing counts of counter 40 and which may be selectively written at selected addresses in a memory 50. Further, the channel selecting apparatus according to this invention, as shown on FIG. 1, generally comprises a memory control circuit 60 for selectively establishing the previously mentioned programming mode of operation or a channel selecting mode in which a channel identifying binary code previously written or stored at a selected address in memory 50 is read out therefrom, as indicated at $C_1, C_2, C_3 \cdots C_{14}$, with such read out code being applied to counter 40 for establishing the corresponding count in the latter; an address selecting circuit 70 that is manually controllable for activating a selected address in memory 50 for either the writing of a selected channel identifying code at such address or the reading out of a previously stored channel identifying code from the selected address during the programming or channel selecting modes, respectively; and a band indicating signal forming circuit 80 which, in the programming mode of operation, is selectively operable to produce a signal indicating the band of the channel indicating code then being written or stored at a selected address of memory 50, with such band indicating signal being also written or stored at the respective address. Finally, the channel selecting apparatus according to this invention, as shown on FIG. 1, generally comprises a digital-to-analog converter 90 which provides an analog control voltage for the varactor of a selected band in an electronic tuner 100 in correspondence to the count of counter 40 established by a channel identifying digital code selectively read out of memory 50 in a channel selecting mode of the apparatus, or in correspondence to the changing counts of counter 40 produced when the latter counts sweep pulses from generating circuit 30 in the programming mode of the apparatus; and a video intermediate frequency amplifier 110 which receives the tuned frequency output of tuner 100.

In the channel selecting apparatus as generally described above, the clock pulse $A_o$ from generator 10 may have a frequency of, for example, 4 MHz resulting in a period $\tau$ of 0.25 $\mu$sec. In the timing counter 20, such clock pulse $A_o$ is counted to produce pulses $A_1$ to $A_{14}$ which are frequency-divided in sequence so as to range from the pulses $A_1$ having a period of 0.5 $\mu$sec. and a pulse width of 0.25 $\mu$sec., to the pulses $A_{14}$ having a period of 4.096 m.sec. and a pulse width of 2.048 m.sec., thereby to form a 14-bit circulating digital code constituted by the pulses $A_1, A_2, A_3, \cdots A_{14}$. It will be apparent that such 14-bit circulating digital code changes its state $2^{14}$ times, that is, 16,384 times, within the circulating or repeating period of $T = a^{14}\tau = 4.096$ m.sec. (FIGS. 5A-5C).

In the sweep pulse generating circuit 30 as shown on FIG. 1, a fine up-sweep switch 31FU, a fine down-sweep switch 31FD, a coarse up-sweep switch 31CU and a coarse down-sweep switch 31CD are connected in series circuits with respective resistors $32_1, 32_2, 32_3$ and $32_4$, and such series circuits are connected in parallel between a voltage source +5V and ground. The switches 31FU, 31FD, 31CU and 31CD are normally open, as shown, to provide signals at the relatively high level "1" at the junctions of such switches with the respective resistors $32_1, 32_2, 32_3$ and $32_4$. Further, the switches 31FU, 31FD, 31CU and 31CD are adapted to be selectively manually displaced to the closed condition thereof for providing a signal at the low level "0" at the junction of the closed switch with the respective resistor $32_1$–$32_4$. Such signals "1" or "0" from switches 31FU, 31FD, 31CU and 31CD are applied through inverters $33_1, 33_2, 33_3$ and $33_4$ to first inputs of NAND circuits $34_1, 34_2, 34_3$ and $34_4$, respectively. As hereinafter described in detail, in the sweep pulse generating circuit 30 of the channel selecting apparatus according to this invention, a coarse sweep pulse generator 130C produces coarse sweep pulses which are applied to second inputs of NAND circuits $34_3$ and $34_4$, and a fine sweep pulse generator 130F produces fine sweep pulses which are applied to second inputs of NAND circuits $34_1$ and $34_2$. The outputs of NAND circuits $34_1$ and $34_3$ are connected to first and second inputs of a NAND circuit 36 which has its output applied to an inverter 37 for producing either the fine or coarse up-sweep pulses $P_U$, while the outputs of NAND circuits $34_2$ and $34_4$ are similarly connected to first and second inputs of a NAND circuit 38 which has its output applied to an inverter 39 for producing either the fine or coarse down-sweep pulses $P_D$.

Figure 2:
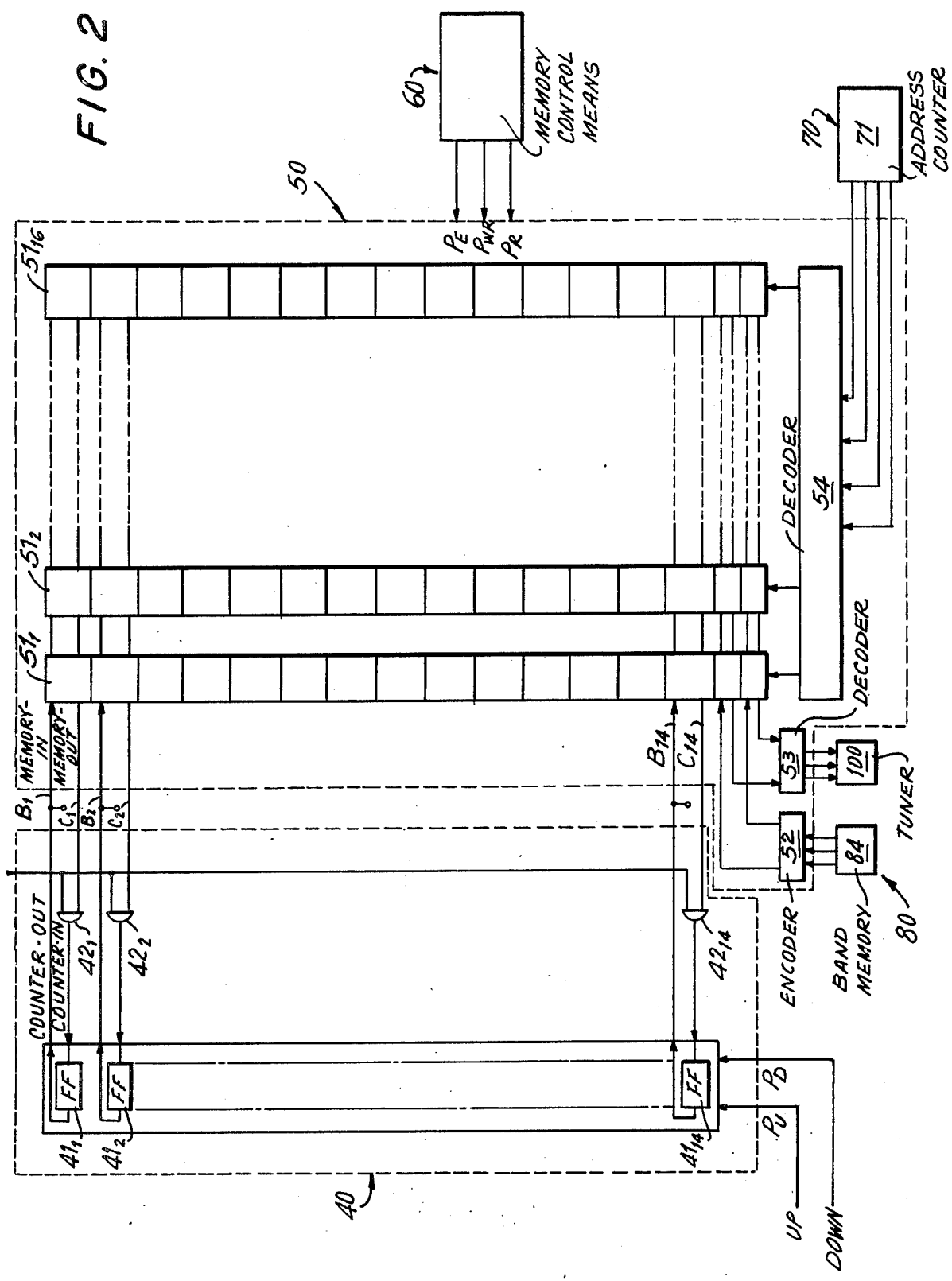
FIG. 2 is a block diagram illustrating, in greater detail, an up-down counter for generating channel identifying codes and a memory which are included in the apparatus of FIG. 1.

As shown schematically on FIG. 2, the counter 40 may be a conventional 14-bit up-down counter having 14 flip-flops $41_1, 41_2$---$41_{14}$ which have their states changed sequentially in the up or down direction when counting the up-sweep pulses $P_U$ or the down-sweep pulses $P_D$, respectively, in the programming mode of operation to establish the respective bits of sequentially changing 14-bit channel identifying binary codes $B_1, B_2$---$B_{14}$. In such programming mode of operation, the channel identifying codes are applied from counter 40 to memory 50 for writing or storage of a selected one of such codes at a selectively activated address in the memory, and the sequentially changing channel identifying codes are also applied from counter 40 to digital-to-analog converter 90 for providing a correspondingly varied control voltage for the varactor in a selected band of electronic tuner 100. The flip-flops $41_1$–$41_{14}$ of counter 40 are further adapted, in the channel selecting mode of operation, to have their respective states established by the respective bits $C_1$–$C_{14}$ of a memorized channel identifying code which are read out of a selectively activated address in memory 50 to AND circuits $42_1$–$42_{14}$ which also receive a load pulse $P_B$ during the channel selecting operation for passing the bits read out of the memory, as hereinafter described in detail, and which have their outputs respectively connected to flip-flops $41_1$–$41_{14}$.

As also shown on FIG. 2, the memory 50 may be desirably comprised of 16 memory units $51_1, 51_2$---$51_{16}$ at respective addresses in memory 50, with the memory unit at each address being capable of storing 16-bits of digital information, that is, the 14-bits of a selected channel identifying code from counter 40 and 2-bits from an encoder 52 for the band indicating signal received from circuit 80 for indicating whether the channel identified by the 14-bit digital code being stored at the respective addresss is a vhf or uhf channel, and, if it is a vhf channel, whether it is a low channel or a high channel in such broadcast band, respectively. Further, the memory 50 is schematically shown to include a decoder 53 which, in the programming and channel selecting modes of operation, receives the 2-bits of digital information representing the band of the channels identified by the 14-bit codes being applied to, or read out from the memory units for providing a corresponding band identifying signal applied to electronic tuner 100 for selecting the corresponding band of the latter. Finally, the memory 50 is schematically shown to include a decoder 54 which receives a 4-bit digital code from the address selecting circuit 70, as hereinafter described in detail, and which is effective to activate or address the corresponding one of the memory units $51_1, 51_2$---$51_{16}$. Preferably, the memory units of memory 50 are composed of non-volatile cells, such as, metal-nitride-oxide-silicon (MNOS) elements, so that the contents thereof, while being electrically alterable, are held unchanged during periods when memory 50 is disconnected from a source of power.

Returning again to FIG. 1, it will be seen that the memory control 60 may include a mode change-over switch 61 having a movable contact that is manually actuable to selectively engage fixed contacts a and b. The fixed contact a is connected to a voltage source +5V so that, when the movable contact of switch 61 engages fixed contact a to establish the programming mode of operation, a signal $P_A$ at the relatively high level "1" is obtained from switch 61. On the other hand, the fixed contact b of switch 61 is connected to ground so that, when the movable contact of switch 61 is engaged with fixed contact b for establishing the channel selecting mode of operation, the signal $P_A$ is at the relatively low level "0". Memory control 60 is further shown to have a normally open switch 62 which is connected in series with a resistor 62a between a voltage source +5V and ground. The signal $P_A$ from mode change-over switch 61 is shown to be applied to one input of a NAND circuit 63 which has its other input connected through an inverter 64 with a junction in the connection between switch 62 and resistor 62a. It will be apparent that, when switch 62 is in its normally open position, as shown, the output of inverter 64 will be at the low level "0", whereas, when switch 62 is manually closed to effect a writing operation with the apparatus in its programming mode, the output of inverter 64 will be at the relatively high level "1". The output of NAND circuit 63 is shown to be applied to an instruction signal forming circuit 65 which, when the output of NAND circuit 63 is at the low level "0", supplies an erasing pulse $P_E$ and then a writing pulse $P_{WR}$ to the memory unit at a selected address in memory 50 so as to erase the previously stored contents in such memory unit and, thereafter, to write in the selected memory unit the 14-bit channel identifying code then being received from counter 40 and the 2-bit code which represents the band of the channel identified by the code being written in the respective memory unit. On the other hand, when the output of NAND circuit 63 is at the high level "1", instruction signal forming circuit 65 applies a read pulse $P_R$ to memory unit 50 so as to effect the read out of the contents stored in the memory unit which is then selected.

The band indicating signal forming circuit 80 is shown to include normally open switches $S_L, S_H$ and $S_U$ which are connected in series with respective resistors $81_L, 81_H$ and $81_U$ between a voltage source +5V and ground. Junctions between switches $S_L, S_H$ and $S_U$ and the respective resistors are connected to inverters $82_L, 82_H$ and $82_U$, respectively, which have their outputs connected to first inputs of NAND circuits $83_L, 83_H$ and $83_U$, respectively, while the second inputs of such NAND circuits receive the signal $P_A$ from mode change-over switch 61. The outputs of NAND circuits $83_L, 83_H$ and $83_U$ are applied to a band memory 84 which is effective to apply a band indicating signal $P_L, P_H$ or $P_U$ to encoder 52 in memory 50 in response to a low level or "0" output from the NAND circuit $83_L, 83_H$ or $83_U$, respectively. It will be apparent that, in the programming mode of operation established by engagement of switch 61 with its fixed contact a to provide the signal $P_A$ with the high value "1", the output of the NAND circuit $83_L, 83_H$ or $83_U$ has the low value "0" only when the respective switch $S_L, S_H$ or $S_U$ is manually closed for indicating that the channel identified by the 14-bit code to be written at a selected address in memory 50 is a low vhf channel, a high vhf channel or a uhf channel, respectively.

The address selecting circuit 70 of the illustrated channel selecting apparatus according to this invention includes 16 normally open address selecting switches $S_1, S_2$---$S_{16}$ which are selectively manually actuable to the closed condition for selecting a corresponding one of the 16 addresses or memory units in memory 50 to be activated during a programming operation or channel selecting operation of the apparatus. The address selecting circuit 70 is further shown to include neon tubes or other indicators $N_1$, $N_2$---$N_{16}$ corresponding to the switches $S_1, S_2$---$S_{16}$, an address counter 71 which, in response to the closing of a selected one of the switches $S_1$-$S_{16}$, produces a corresponding 4-bit addressing code applied to the decoder 54 in memory 50 for addressing the corresponding memory unit in the latter, and a decoder 72 which receives the coded output of address counter 71 and, in response thereto, provides a "0" output signal on a respective one of 16 output lines $L_1, L_2$---$L_{16}$. The switches $S_1$-$S_{16}$ are connected, at one side, in common, through series resistors 73 and 74 to ground, while the opposite sides of switches $S_1$-$S_{16}$ are connected to lines $L_1$-$L_{16}$, respectively. Further, the lines $L_1$-$L_{16}$ are connected through resistors $75_1$-$75_{16}$, respectively, and a common resistor 76a with a voltage source +100V, while the neon tubes or indicators $N_1$-$N_{16}$ are connected between the lines $L_1$-$L_{16}$, respectively, and the same voltage source +100V through a common resistor 76b. The junction between series-connected resistors 73 and 74 is connected to the base electrode of a switching transistor 77 having its emitter electrode connected to ground and its collector electrode connected to a voltage source $+V_{cc}$ and to an inverter 78. The output of inverter 78 is connected to one input of a NAND circuit 79 which, at its other input, receives the pulses $A_9$ produced by timing counter 20 and having a period of 0.128 m.sec. Finally, the output of NAND circuit 79 is applied to address counter 71 which is operative to count each "0" output of NAND circuit 79.

In order to provide the load pulse $P_B$ to AND circuits $42_1$-$42_{14}$ of counter 40 for read out to the latter of the channel identifying code $C_1$-$C_{14}$ stored in a selected memory unit of memory 50 in the channel selecting mode of operation, the illustrated apparatus according to this invention is further shown to include an inverter 43 receiving the signal $P_A$ from memroy control 60 and having its output connected to one of the inputs of a NAND circuit 44 which, at its other input, is connected to the output of a monostable multivibrator 45 which is triggered by a relatively high collector output "1" from transistor 77 or from a transistor 46 of a time constant circuit 47. The output of NAND circuit 44 is connected to an inverter 48 which, in turn, has its output connected to AND circuits $42_1$-$42_{14}$ of counter 40 so that the load pulse $P_B$ is produced when the output of NAND circuit 44 is "0", that is, when signal $P_A$ has the value "0" for the channel selecting mode of operation and monostable multivibrator 45 is triggered to produce a pulse having the value "1" for a predetermined period of, for example, 50 m.sec. In the time constant circuit 47, the base electrode of transistor 46 is shown to be connected between a capacitor 46a and a resistor 46b which are connected, in series, between the voltage source $+V_{cc}$ and ground, while the collector of transistor 46 is connected through a resistor 46c with the voltage source and the emitter electrode of transistor 46 is connected to ground. Therefore, when the apparatus is initially connected to a power source, transistor 46 is made conductive and, hence its collector output is "0". After a predetermined lapse of time, for example, of 50 m.sec., transistor 46 is turned off so that its collector output rises to the value "1" for triggering monostable multivibrator 45 which then provides its output for the predetermined time of 50 m.sec.

In the channel selecting apparatus according to this invention, the digital-to-analog converter 90 preferably includes a pulse-width modulator 91 operative to produce a chain of pulses at a predetermined repetition rate with the width of each of such pulses being dependent on the channel identifying code $B_1, B_2$---$B_{14}$ obtained from counter 40 either in response to the counting by the latter of the sweep pulses from generating circuit 30 or in response to the read out of a channel identifying code stored at a selected address in memory 50, and a low pass filter 92 which receives the chain of pulses from modulator 91 for providing the analog control voltage for a varactor of electronic tuner 100 in dependence on the modulated width of the pulses. More particularly, the pulse-width modulator 91 determines the pulse width of the chain of pulses applied to low pass filter 92 in dependence on the absence of coincidence between the channel identifying code $B_1, B_2$---$B_{14}$ obtained from counter 40 and the circulating digital code $A_1, A_2$---$A_{14}$ applied to modulator 91 from timing counter 20.

Figure 3:
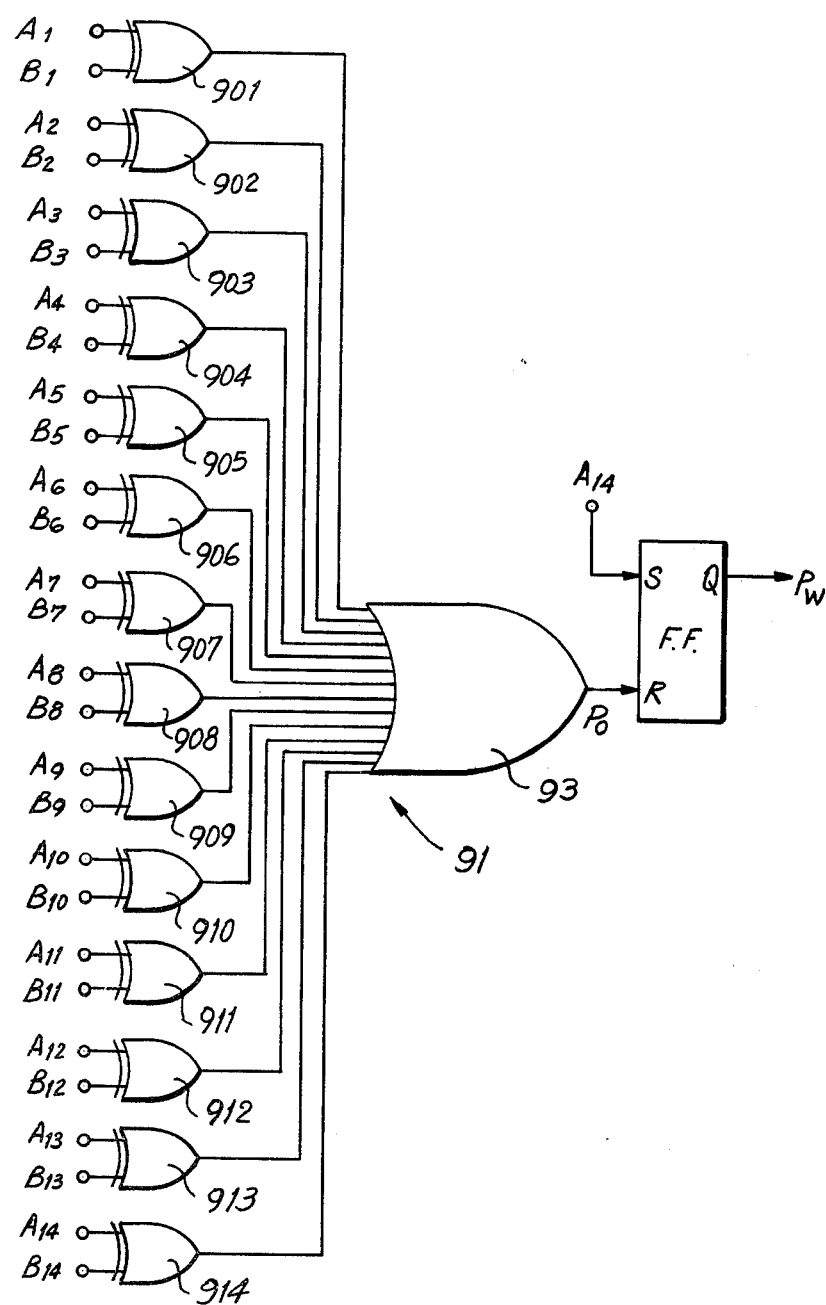
FIG. 3 is a detail block diagram of a pulse-width modulator which is included in the apparatus shown on FIG. 1.

As shown on FIG. 3, the pulse-width modulator 90 may advantageously include fourteen exclusive OR circuits 901,902---914 having first and second inputs which respectively receive the bits or pulses $A_1, A_2$---$A_{14}$ of the circulating code and the bits $B_1, B_2$---$B_{14}$ of the channel identifying code. The outputs of all of the exclusive OR circuits 901-914 are applied through an OR circuit 93 to the reset terminal R of a flip-flop 94 which has the pulse $A_{14}$ with a period of 4.096 m.sec. applied from timing counter 20 to the set terminal S of flip-flop 94. The flip-flop 94 is adapted to be set by the falling edge or side of each pulse $A_{14}$ so as to provide an output of value "1" at its output terminal Q, that is, to initiate an output pulse $P_W$. Further, flip-flop 94 is reset to terminate the output pulse $P_W$, that is, to return the output voltage to "0", in response to the falling edge or side of an output $P_O$ from OR circuit 93.

As is apparent from FIGS. 5I-5K, an output pulse $P_W$ is initiated at the output Q of flip-flop 94 when the circulating code $A_1, A_2$---$A_{14}$ returns from the state (11111111111111) to the state (00000000000000). So long as the circulating code $A_1, A_2$---$A_{14}$ is not coincident in level with the channel identifying code then being applied to pulse-width modulator 91, one or more of the exclusive OR circuits 901-914 produces an output "1" with the result that the output $P_O$ of OR circuit 93 remains at the level "1". Upon the coincidence of all bits of the circulating code $A_1, A_2$---$A_{14}$ with the corresponding bits of the channel identifying code $B_1, B_2$---$B_{14}$ during each circulating period T of the circulating code, the outputs of all of the exclusive OR circuits 901-914 attain the value "0", with the result that the output $P_O$ of OR circuit 93 falls from the value "1" to the value "0" so as to reset flip-flop 94 and thereby return the output of the latter to the value "0". Thus, during each circulating period T of the circulating code $A_1, A_2$---$A_{14}$ from timing counter 20 an output pulse $P_W$, that is, an output of the value "1", is obtained from flip-flop 94 during the time interval between the return of the circulating code $A_1,A_2$---$A_{14}$ from the state (11111111111111) to the state (00000000000000) and the coincidence of the circulating code with the channel identifying code $B_1,B_2$---$B_{14}$. Therefore, when a change is effected in the channel identifying code $B_1,B_2$---$B_{14}$ being applied to pulse-width modulator 91, a corresponding change occurs in the width of the output pulse $P_W$ obtained from modulator 91 during each circulating period of the circulating code.

The output pulses $P_W$ produced by modulator 91 during the successive circulating periods T of the circulating code $A_1,A_2$---$A_{14}$, and which have their pulse-widths determined by the channel identifying code $B_1,B_2$---$B_{14}$ then being received by the modulator, are applied to low pass filter 92 which is effective to smooth such output pulses $P_W$ from modulator 91 and to deliver an analog or DC voltage having a value that corresponds to the width of the pulses $P_W$.

In the electronic tuner 100 a signal $V_H$, $V_L$ or U received from decoder 53 of memory 50 causes operation of either the high band or the low band of a vhf tuning section or the uhf tuning section, respectively, and the voltage controlled variable reactance element or varactor, such as, a variable capacitance diode, of the selected tuning section is controlled by the analog or DC control voltage from low pass filter 92 for determining the receiving frequency. Finally, such receiving frequency is applied to the video intermediate frequency amplifier circuit 110 and the output of the latter is applied to a video detector circuit (not shown) as in a conventional color television receiver.

The above described channel selecting apparatus operates as follows:

PROGRAMMING MODE OF OPERATION

When it is desired to program the channel selecting apparatus, that is, to store at the various addresses in memory 50 channel identifying codes corresponding to various channels that are receivable in the region where the television receiver is located so that, thereafter, such channels can be received or selected merely by actuation of the switches $S_1$-$S_{16}$ corresponding to the respective addresses, the mode change-over switch 61 is engaged with its fixed contact a for selecting the programming mode of operation. If it is desired, for example, to store at the address or memory unit $51_1$ of memory 50 a channel identifying code corresponding to the receiving frequency for channel "one" in the Tokyo area of Japan, the address selecting switch $S_1$ is manually closed. Closing of switch $S_1$ turns ON transistor 77 in address selecting circuit 70 so that the collector output of such transistor has the value "0". Thus, the output of inverter 78 becomes "1" with the result that NAND circuit 79 provides a "0" output on receiving each of the pulses $A_9$ from timing counter 20. The address counter 71 counts each of the "0" outputs from NAND circuit 79. When the resulting 4-bit code from address counter 71 corresponds to the address or memory unit $51_1$ selected by the closing of switch $S_1$, the decoder 72 responds to such 4-bit code from address counter 71 to provide a "0" output on the corresponding output line $L_1$. In response to such "0" output on line $L_1$, transistor 77 is turned OFF with the result that the output of NAND circuit 79 remains at "1" and address counter 71 ceases counting. Accordingly, the 4-bit code corresponding to switch $S_1$ is applied to memory 50 for selecting or activating the address or memory unit $51_1$ corresponding to switch $S_1$.

Since channel "one" in the Tokyo area, that is, a low vhf channel, is to be programmed in memory unit $51_1$, switch $S_L$ of the band indicating signal forming circuit 80 is closed to provide an output "1" from the respective inverter $82_L$. Since mode change-over switch 61 is engaged with its fixed contact a, its output $P_A$ is "1" and, therefore, the output of NAND circuit $83_L$ becomes "0". Band memory 84 responds to such "0" output from NAND circuit $83_L$ to provide the band selecting pulse $P_L$ which, through encoder 52 and decoder 53 of memory 50 provides the signal $V_L$ for selecting the low band or channel of the vhf tuning section in tuner 100.

Having selected the address or memory unit of memory 50 at which a channel identifying code is to be programmed and the band or section of tuner 100 which is appropriate for the channel to be programmed at such selected address, the sweep pulse generating circuit 30 is made operative, for example, by manually actuating the coarse up-sweep switch 31CU and holding the latter in its closed position. The closing of switch 31CU causes the associated inverter $33_3$ to provide the output "1" to NAND circuit $34_3$. Therefore, at each "0" state of the coarse sweep pulses from generator 130C, NAND circuit $34_3$ provides an output "1". Since the fine up-sweep switch 31FU is open, the output of its associated inverter $33_1$ is "0" and the output of the respective NAND circuit $34_1$ is "1". Therefore, the output of the NAND circuit 36 becomes "0" at every "1" output from NAND circuit $34_3$, that is, at every "0" state of the coarse sweep pulses. Accordingly, an up-sweep pulse $P_U$ appears at the output of inverter 37 at every "0" state of the coarse sweep pulses from generator 130C. Since such pulses have a relatively short period, the pulses $P_U$ appearing while switch 31 CU is held in its closed condition may be considered coarse up-sweep pulses which, when being counted by counter 40, cause relatively rapid changes in the count of such counter 40. In other words, when counting the coarse up-sweep pulses $P_U$ from generating circuit 30, the count of counter 40 is changed, in sequence, in the upward direction to similarly change the resulting channel identifying code $B_1,B_2$---$B_{14}$ obtained from counter 40 at every circulating period of the circulating code $A_1,A_2$---$A_{14}$ from timing counter 20, starting from the state (00000000000000). The changing channel identifying code from counter 40 and the circulating code from timing counter 20 are applied to pulse-width modulator 91 in the programming mode of operation. Since the circulating code $A_1,A_2$---$A_{14}$ changes at every time $\tau = 0.25$ μ sec. which is the width of the pulses $A_1$, the width of the output pulse $P_W$ from modulator 91 is increased by $\tau$ at every circulating period T of the circulating code starting from a pulse width of zero. Thus, so long as switch 31CU of sweep pulse generating circuit 30 is held in its closed condition, the channel selecting or control voltage from low pass filter 92 is increased progressively, for example, by about 2 m.V. at every period T=4.096 m.sec. of the circulating code, and hence the receiving frequency established by tuner 100 increases progressively.

When a video picture being broadcast or transmitted by channel "one" appears on the screen of the television receiver, the coarse up-sweep switch 31CU is released by the operator so as to return to its normal open condition. Upon opening of switch 31CU, the supplying of the coarse up-sweep pulses $P_U$ to counter 40 is terminated so that counter 40 ceases its counting action and the channel identifying code $B_1,B_2$---$B_{14}$ then obtained from counter 40 determines the approximate value of the receiving frequency of tuner 100 for the desired channel. Thereafter, the fine up-sweep switch 31FU may be manually actuated and held in its closed condition to provide fine up-sweep pulses $P_U$ from inverter 37, which fine up-sweep pulses have a period many times that of the coarse up-sweep pulses, as hereinafter described in detail. Therefore, in counting the fine up-sweep pulses, the counter 40 sequentially changes the resulting channel identifying code $B_1, B_2$---$B_{14}$ at a relatively slow rate, and the receiving frequency determined by tuner 100 is similarly slowly changed. When viewing of the picture on the screen of the television receiver indicates that fine tuning has been achieved in respect to the video signal broadcast by the desired channel, switch 31FU is released to return to its open condition and thereby halt the supplying of the fine up-sweep pulses to counter 40. Accordingly, counter 40 stops counting with the resulting channel identifying code $B_1, B_2$---$B_{14}$ corresponding to a value of the analog control voltage applied from digital-to-analog converter 90 to tuner 100 corresponding to a receiving frequency for the fine-tuned reception of channel "one". Thereafter, the writing switch 62 is manually closed so that the associated inverter 64 provides the output "1". Since the mode change-over switch 61 remains engaged with its fixed contact a to provide the output $P_A$ with the value "1", the NAND circuit 63 provides the output "0". As a result of such "0" output from NAND circuit 63, the instruction signal forming circuit 65 first supplies an erasing pulse $P_E$ to memory 50 so as to erase any contents previously stored in the memory unit $51_1$ selected by the closing of switch $S_1$. Then, circuit 65 applies a writing pulse $P_{WR}$ to memory unit $51_1$ with the result that the channel identifying code $B_1, B_2$---$B_{14}$ established by counter 40 for fine-tuning of channel "one" and the band identifying signal $P_L$ from band memory 84 are then written in the respective cells of memory unit $51_1$.

Following the programming of memory unit $51_1$ with a channel identifying code and a band indicating code corresponding to channel "one", the other memroy units $51_2$–$51_{16}$ of memory 50 may be similarly programmed with coded information corresponding to other vhf and/or uhf channels that are receivable in the region where the television receiver is located.

Although the programming of the channel selecting apparatus has been described above as being effected by the sequential closing of the coarse up-sweep switch 31CU and the fine up-sweep switch 31FU, in which case, the coarse or fine up-sweep pulses $P_U$ are counted in the upward direction by counter 40 for progressively increasing the receiving frequency of tuner 100, it will be apparent that the programming operations can be similarly effected by the successive closing of the coarse down-sweep switch 31CD and the fine down-sweep switch 31FD so that counter 40 is made to count in the downward direction for progressively decreasing the receiving frequency of tuner 100. Whether counter 40 is made to count in the upward direction or in the downward direction, as aforesaid, is merely dependent upon the relationship of the receiving frequency for a channel which is to be programmed relative to the receiving frequency for the channel which has been previously programmed and, in each case, the direction in which counter 40 is made to count is selected so as to minimize the time required for the programming operation.

CHANNEL SELECTING MODE OF OPERATION

After the programming of memory 50 has been completed, as described above, the mode change-over switch 61 is manually actuated to engage its fixed contact b and thereby provide the output $P_A$ with the value "0" for establishing the channel selecting mode of operation for the apparatus. Since writing switch 62 remains in its open position, the output of the associated inverter 64 is "0" and, accordingly, NAND circuit 63 provides the output "1" to instruction signal forming circuit 65 so that the latter supplies the reading pulse $P_R$ to memory 50.

Preferably, when the power source for the channel selecting apparatus is initially turned ON, the address counter 71 of address selecting circuit 70 is reset thereby so that the 4-bit code issuing from counter 71 will activate or address the memory unit $51_1$ in memory 50.

When the power source for the channel selecting apparatus is initially turned ON, the transistor 46 in time constant circuit 47 is made conductive so that its collector output is "0" for a predetermined period of, for example, 50 m.sec., whereupon transistor 46 is turned OFF and its collector output rises to the value "1". Such rise in the collector output of transistor 46 triggers the monostable multivibrator 45 to provide an output pulse from the latter at the level "1" for the predetermined time of 50 m.sec. Since the output $P_A$ from mode change-over switch 61 is "0" for the channel selecting mode of operation, the output from inverter 43 is "1" and, therefore, the output from NAND circuit 44 is "0" for the predetermined time or period of the output pulse from monostable multivibrator 45. Such "0" output from NAND circuit 44 causes the inverter 48 to produce the output "1", that is, the load pulse $P_B$ for the period of the output pulse from monostable multivibrator 45. The load pulse $P_B$, when applied to AND circuits $42_1$–$42_{14}$ in the counter 40, allows the read out to counter 40 from memory unit $51_1$ of the channel identifying code $C_1, C_2$---$C_{14}$ previously stored therein and which, in the example described above, represents channel "one" in the Tokyo area. At the same time, the band indicating code stored in the respective cells of memory unit $51_1$ is read out from the latter to decoder 53 so that, in the described example, the signal $V_L$ is applied to tuner 100 for selecting the low band of the vhf tuning section. During the existence of load pulse $P_B$, the bits $C_1$–$C_{14}$ of the read out channel identifying code are applied to the respective flip-flops $41_1$–$41_{14}$ of counter 40 with the result that such flip-flops assume the states for providing the channel identifying code $B_1$–$B_{14}$ from counter 40 to pulse-width modulator 91 which corresponds to a control voltage for tuner 100 suitable for fine tuning of the receiving frequency to that of channel "one". Therefore, upon the initial supplying of power to the channel selecting apparatus, the latter tunes the television receiver for the reception of the channel which has been programmed into the first address or memory unit $51_1$ of memory 50.

Thereafter, if it is desired to receive a channel programmed in a memory unit of memory 50 other than the first address or memory unit $51_1$, for example, if it is desired to receive channel "three" which has been programmed in the second memory unit $51_2$, the switch $S_2$ of the address selecting circuit 70 is manually closed and, as previously described in connection with the programming mode of operation, the address counter 71 counts the pulses $A_9$ until the 4-bit code from address counter 71 addresses the second memory unit $51_2$ for causing read out of the channel identifying code and band indicating code stored in that memory unit during the programming of channel "three" in memory unit $51_2$. When the code from address counter 71 addresses the memory unit corresponding to closed switch $S_2$, decoder 72 provides the signal "0" on the respective output line $L_2$ so that transistor 77 is turned OFF and its collector output rises from "0" to "1". Such rise in the collector output of transistor 77 triggers monostable multivibrator 45 and, as previously described, the output from monostable multivibrator 45 results in the production of a load pulse $P_B$ from inverter 48. In response to the load pulse $P_B$, the channel identifying code being read out of memory unit $51_2$ correspondingly changes the states of the flip-flops of counter 40 so that the latter provides the corresponding channel identifying code $B_1,B_2$---$B_{14}$ to pulse width modulator 91. Therefore, the output pulse $P_W$ obtained from modulator 91 during each circulating period of the circulating code $A_1,A_2$---$A_{14}$ has its width determined by the channel identifying code so as to result in an analog control voltage from low pass filter 92 to tuner 100 sufficient to cause the latter to establish the receiving frequency for channel "three".

It will be apparent that the channels programmed in the other memory units $51_3$–$51_{16}$ may be similarly selectively received merely by manual closing of a respective one of the address selecting switches $S_1$–$S_{16}$.

As is well known, existing voltage-controlled variable reactance devices, such as, variable capacitance diodes, have a non-linear relation between the control voltage therefor and the resulting receiving frequency. For example, as shown on FIG. 6, as the tuning or receiving frequency is progressively increased, an increased change in the control voltage is required for achieving each incremental increase in the receiving frequency. Therefore, in the programming mode of the above described channel selecting apparatus, the number of sweep pulses from circuit 30 that have to be counted by counter 40 for changing the code $B_1,B_2$---$B_{14}$ so as to achieve each incremental or unit increase in the receiving frequency at the upper portion of the range of receiving frequencies is substantially greater than the number of sweep pulses to be counted for achieving the same incremental increase in the receiving frequency at the lower portion of the range of receiving frequencies. If the coarse and fine sweep pulses applied to counter 40 have uniform periods over the full range of the receiving frequencies for which memory 50 is to be programmed, substantially greater time will be required for tuning from one channel to another when programming a plurality of selected channels having relatively high receiving or tuning frequencies than for tuning from one channel to another when programming channels in the lower portion of the range of receiving frequencies.

In accordance with the present invention, the above problem is avoided by varying the period of the sweep pulses applied to counter 40 in the programming mode so that the rate of change of the receiving frequency is substantially uniform over the range of the progressively changing binary codes from counter 40, that is, over the range of the receiving frequencies. More particularly, in the illustrated embodiment of the invention, the period of the fine sweep pulses $P_F$ issuing from generator 130F and the period of the coarse sweep pulses $P_C$ issuing from generator 130C are varied in response to changes in the binary codes $B_1,B_2$---$B_{14}$ from counter 40.

Figure 4:
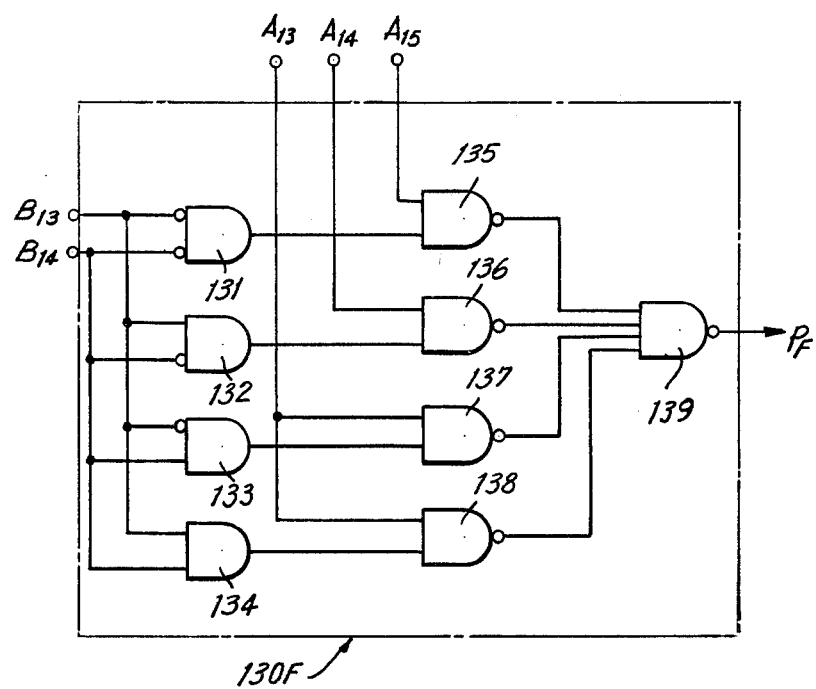
FIG. 4 is a detail block diagram of a portion of a sweep pulse generating circuit included in the apparatus of FIG. 1.

In order to achieve such variation in the period of the fine sweep pulses $P_F$, the fine sweep pulse generator 130F is shown in FIG. 4 to comprise a decoder for the two upper bits $B_{13}$ and $B_{14}$ of the binary codes from counter 40, which decoder is constituted by AND circuits 131,132,133 and 134 each having first and second inputs receiving the bits $B_{13}$ and $B_{14}$, respectively. The AND circuit 131 provides an output "1" when the bits $B_{13}$ and $B_{14}$ are both "0"; the AND circuit 132 provides an output "1" when the bit $B_{13}$ is "1" and the bit $B_{14}$ is "0"; the AND circuit 133 provides an output "1" when the bit $B_{13}$ is "0" and the bit $B_{14}$ is "1"; and the AND circuit 134 provides an output "1" when the bits $B_{13}$ and $B_{14}$ are both "1". The fine sweep pulse generator 130F further comprises NAND circuits 135,136,137 and 138 having first inputs which receive the outputs of AND circuits 131,132,133 and 134, respectively. Further, second inputs of NAND circuits 137 and 138 receive the bit $A_{13}$ of the circulating code from timing counter 20, which bit $A_{13}$ has the period $T/2=2.048$ m.sec.; the second input of NAND circuit 136 receives the bit $A_{14}$ of the circulating code having the period $T=4.096$ m.sec.; and such bit $A_{14}$ is also applied to a frequency divider 35 (FIG. 1) to have its frequency divided by 2 for providing a pulse $A_{15}$ having the period $2T=8.19$ m.sec. which is applied to the second input of NAND circuit 135. Finally, the outputs of the four NAND circuits 135–138 are applied to respective inputs of a NAND circuit 139 which, at its output, provides the fine sweep pulses $P_F$.

Figure 6:
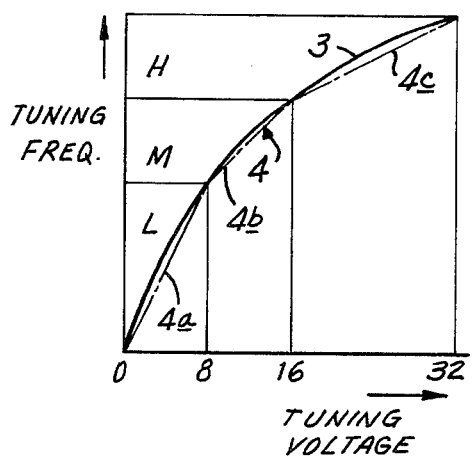

It will be apparent that, when $B_{13}$ and $B_{14}$ are both "0" so that AND circuit 131 provides the output "1", the respective binary codes $B_1,B_2$---$B_{14}$ represent control voltages corresponding to receiving frequencies in a relatively low range, for example, as indicated at L on FIG. 6. When the output of AND circuit 131 is "1", as aforesaid, the output of NAND circuit 135 is "1" at the "0" level of pulse $A_{15}$ and "0" at the "1" level of pulse $A_{15}$. Since the outputs of NAND circuits 136,137 and 138 remain at "1" so long as $B_{13}$ and $B_{14}$ are both "0", the output of NAND circuit 139 is "0" at the "0" level of pulse $A_{15}$ and "1" at the "1" level of pulse $A_{15}$. As a result, the pulse $A_{15}$ having the period $2T=8.19$ m.sec. issues from the output of NAND circuit 139 as the fine sweep pulse $P_F$ so long as $B_{13}$ and $B_{14}$ are both "0".

Similarly, when the bits $B_{13}$ and $B_{14}$ of the binary codes from counter 40 are "1" and "0", respectively, so that such binary codes represent control voltages corresponding to receiving frequencies in the middle range indicated at M on FIG. 6, then the pulse or bit $A_{14}$ of the circulating code having the period $T=4.096$ m.sec. issues from the output of NAND circuit 139 as the fine sweep pulse $P_F$. Further, when the bits $B_{13}$ and $B_{14}$ of the binary codes from counter 40 are "0" and "1", or when bits $B_{13}$ and $B_{14}$ are both "1", so that the respective binary codes represent control voltages corresponding to receiving frequencies in the high range H on FIG. 6, the pulse or bit $A_{13}$ of the circulating code having the period $T/2=2.048$ m.sec. issues from the output of NAND circuit 139 as the fine sweep pulse $P_F$.

The coarse sweep pulse generator 130C may be similar to the fine sweep pulse generator 130F described above with reference to FIG. 6. However, in the case of the coarse sweep pulse generator 130C, the pulse $A_{10}$ of the circulating code is applied, in place of the pulse $A_{13}$, to the NAND circuits 137 and 138; the pulse $A_{11}$ of the circulating code is applied, in place of the pulse $A_{14}$, to the NAND circuit 136; and the pulse $A_{12}$ of the circulating code is applied, in place of the pulse $A_{15}$, to the NAND circuit 135. Therefore, the coarse sweep pulse $P_C$ issuing from generator 130C is the pulse $A_{12}$ having the period T/4=1.024 m.sec. when $B_{13}$ and $B_{14}$ are both "0", the pulse $A_{11}$ having the period T/8=512 μsec. when $B_{13}$ and $B_{14}$ are "1" and "0", respectively, and the pulse $A_{10}$ having the period T/16=256 μsec. when $B_{13}$ and $B_{14}$ are "0" and "1", respectively, or when $B_{13}$ and $B_{14}$ are both "1".

When the previously described programming operation of the above channel selecting apparatus according to this invention is initiated, for example, by manual closing of the fine up-sweep switch 31FU, the output of inverter $33_1$ becomes "1". As a result, NAND circuit $34_1$ produces the output "1" at every "0" level of the fine sweep pulse $P_F$ from fine sweep pulse generator 130F. The open state of the coarse up-sweep switch 31CU causes the inverter $33_3$ to produce the output "0" and hence the output of NAND circuit $34_3$ becomes "1". Therefore, NAND circuit 36 produces the output "0" at every "0" level of the fine sweep pulse $P_F$, causing inverter 37 to produce the output $P_U$ of "1". This output $P_U$ is counted as a fine up-sweep pulse by the channel selecting code generating counter 40 and as a result the binary channel selecting code $B_1,B_2$---$B_{14}$ from counter 40 changes in the upward direction from the state (00000000000000). In this case, since the two upper bits $B_{13}$ and $B_{14}$ of the binary channel selecting code $B_1,B_2$---$B_{14}$ are both "0" at the beginning, the pulse $A_{15}$ (FIG. 5D) is obtained as the fine sweep pulse $P_F$. The channel selecting code $B_1,B_2$---$B_{14}$, as shown by a solid line 1a on FIG. 5H, changes in turn at every falling edge of the pulse $A_{15}$, or at every period 2T, while the circulating code $A_1,A_2$---$A_{14}$ from the timing counter 20 changes at ever period $\tau = 0.25$ μsec., which is the pulse width of the least significant bit $A_1$ (FIG. 5A). Therefore, the time interval between the return of the circulating code $A_1,A_2,A_{14}$ from the state (11111111111111) to (00000000000000) and the coincidence of the circulating code with the channel selecting code $B_1,B_2$---$B_{14}$, or the pulse width of the output pulse $P_W$ from the pulse width modulator 91, is increased by $\tau$ at every period 2T, for example, as shown at $X_a$ on FIG. 5I. In response to such increase in the width of pulse $P_W$, the channel selecting voltage from the low-pass filter 92 is increased, for example, by about 1.95 mV at every period 2T, thereby gradually increasing the receiving frequency in the tuner 100. When a video picture being broadcast or transmitted by a desired channel appears on the screen of the television receiver, switch 81FU is released to return to its open position and to halt the supplying of the up-sweep pulse $P_U$ to counter 40. As a result, the binary channel identifying code $B_1,B_2$---$B_{14}$ stops changing in a state corresponding to the control voltage for tuning to the receiving frequency for the desired channel, whereupon, such channel selecting or identifying code may be written at a selected address in memory 50, as previously described in detail.

The foregoing operations may be repeated in sequence so as to fully program the memory 50, that is, to write at the several addresses of memory 50 the binary channel identifying codes $B_1,B_2$---$B_{14}$ which correspond to the control voltages for obtaining the receiving frequencies of respective channels. However, it will be understood that, in the channel selecting apparatus according to this invention, the rate of change of the control voltage from low-pass filter 92, as well as the rate of change of the binary channel identifying codes from counter 40, is automatically shifted in three stages during the programming operation.

Figure 7:
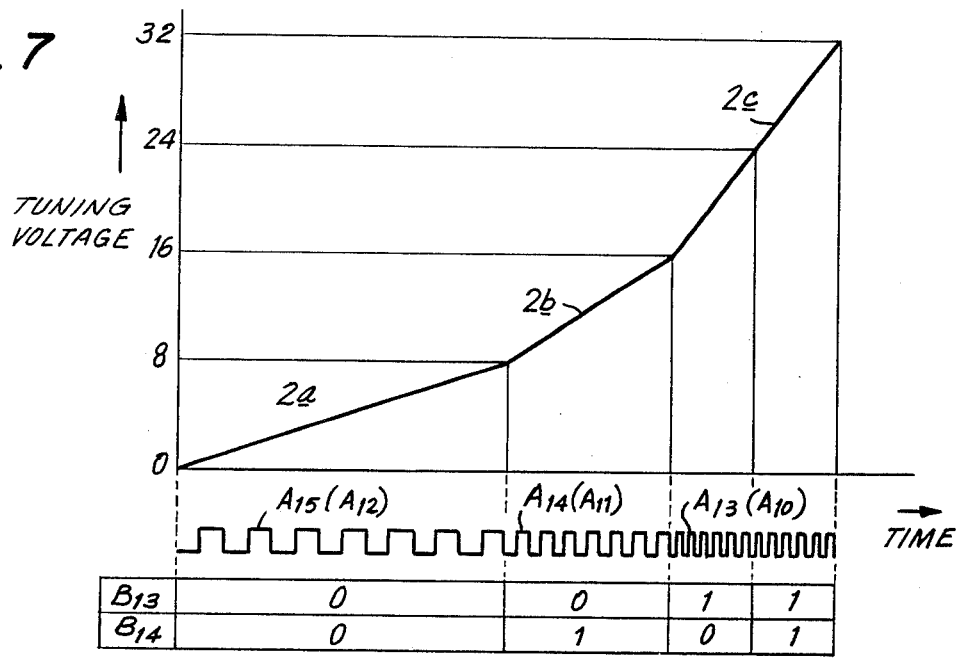
FIGS. 6, 7 and 8 are graphs to which reference will be made in explaining the present invention and the problem solved thereby.

If, for example, the fine up-sweep switch 31FU is closed, as stated above, to thereby drive the channel identifying code generating counter 40, and the two upper bits $B_{13}$ and $B_{14}$ of the channel identifying code $B_1,B_2$---$B_{14}$ are both "0" at the beginning, the channel identifying code $B_1,B_2$---$B_{14}$ changes at every period 2T of the pulse $A_{15}$, as mentioned above. The channel selecting or control voltage from the low-pass filter 92 is thus increased by about 1.95 mV at every period 2T. However, when the channel identifying code $B_1,B_2$---$B_{14}$ becomes (01000000000000) that is $B_{13}$ is "1" and $B_{14}$ is "0", and as a result the pulse width modulator 91 delivers the output pulse $P_W$ having the pulse width of $2^{12}\tau$, or 4096$\tau$, to the low-pass filter 92 thereby to produce the control voltage of 8 V, the fine sweep pulse $P_F$ from the fine sweep pulse generator 130F becomes the pulse $A_{14}$. The channel selecting code $B_1,B_2$---$B_{14}$ is changed by this pulse $A_{14}$ at every period T, as illustrated by the broken line 1b on FIG. 5G. Therefore, the pulse width of the output pulse $P_W$ from pulse width modulator 91 is increased by $\tau$ at every period T so as to have the pulse widths $(2^{12} + 1)\tau$, $(2^{12} + 2)\tau$, $(2^{12} + 2 + 1)\tau$...etc., as indicated at Xb on FIG. 5J, and thus the channel selecting or control voltage from low-pass filter 92 is increased by about 1.95 mV at every period T. Further, when the channel selecting code $B_1,B_2$---$B_{14}$ becomes (10000000000000), that is, $B_{13}$ is "0" and $B_{14}$ is "1", the pulse width modulator 91 delivers the output $P_W$ having the pulse width of $2^{13}\tau$, or 8192$\tau$, to low-pass filter 92 thereby to produce the control voltage of 16V. At this time, the fine sweep pulse $P_F$ from the fine sweep pulse generator 130F becomes the pulse $A_{13}$, which sequentially changes the channel identifying code $B_1,B_2$---$B_{14}$ at every period T/2 as shown by the chain line 1c on FIG. 5F. As a result, the pulse width of the output pulse $P_W$ from the pulse width modulator 91 is increased by 2$\tau$ at every period T so as to have the pulse width $(2^{13} + 2)\tau$, $(2^{13} + 2^2)\tau$, $(2^{13} + 2^2 + 2)\tau$, $(2^{13} + 2^3)\tau$...etc. as illustrated at Xc on FIG. 5K, and thus the channel selecting or control voltage from low-pass filter 92 is increased by about 3.90 mV at every period T. In other words, if the channel selecting or control voltage in the range of 0 to 8V for receiving the low-frequency region of a band is assumed to have a rate of change with time of 1, as represented by the straight line 2a on FIG. 7; then, when the channel selecting or control voltage, as shown by the straight line 2b, changes in the range of 8 to 16V for receiving a mid-frequency region of the band, the rate of change thereof with time is 2, and when the channel selecting or control voltage, as shown by the straight line 2c, changes in the range of 16 to 32V for receiving a high-frequency region of the band, the rate of change thereof with time is 4.

Figure 8:
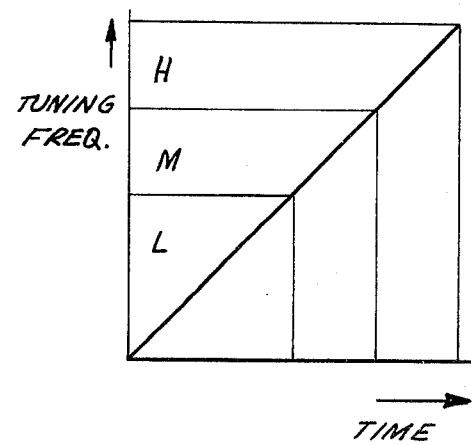

Therefore, if tuner 100 employs, as a tuning element, a voltage-controlled, variable reactance element such as, for example, a variable capacitance diode, having a receiving frequency vs. channel selecting or control voltage characteristic which exhibits the nonlinearity illustrated by the solid line 3 on FIG. 6, successive regions of the curve 3 may be considered to be approximately linear as shown by the chain line 4. In such case, it will be seen that, if the rate of change of the receiving frequency with the channel selecting or control voltage between 0 and 8V, that is, in the low-frequency region represented by the straight line 4a, is considered to be 1, then such rate of change is ½ for the mid-frequency region represented by the straight line 4b and ¼ for the high-frequency region represented by the straight line 4c. It will be appreciated that the combination of the two characteristic curves of FIGS. 6 and 7, upon programming, makes the receiving frequency change of the tuner 100 with time approximately uniform over the low-, mid-, and high-frequency regions as indicated at L,M and H on FIG. 8. Accordingly, in the channel selecting apparatus according to this invention, the binary channel identifying codes $B_1,B_2$---$B_{14}$ corresponding to selected channels within a wide range of receiving frequencies can be established by counter 40 at a substantially uniform speed or rate.

Of course, a similar result is achieved when the counter 40 is counting coarse sweep pulses $P_C$ from generator 130C, for example, in response to manual closing of coarse up-sweep switch 31CU. When the two upper bits $B_{13}$ and $B_{14}$ of the channel identifying code $B_1,B_2$---$B_{14}$ are both "0" at the beginning, the channel identifying code $B_1,B_2$---$B_{14}$ is changed by the pulse $A_{12}$ at every period ¼T. The pulse width of the output pulse $P_W$ is thus increased 4τ at every period T and, therefore, the channel selecting or control voltage from low-pass filter 92 is increased by about 7.8 mV at every period T. After the channel identifying code $B_1,B_2$---$B_{14}$ becomes (01000000000000), the channel identifying code $B_1,B_2$---$B_{14}$ is changed by the pulse $A_{11}$ at every period ⅛T. The pulse width of the output pulse $P_W$ is thus increased 8τ at every period T, and, therefore, the channel selecting or control voltage is increased by about 15.60 mV at every period T. After the channel identifying code $B_1,B_2$---$B_{14}$ becomes (10000000000000), the code $B_1,B_2$---$B_{14}$ is changed by the pulse $A_{10}$ at every period 1/16T. The pulse width of the output pulse $P_W$ is increased 16τ at every period T, and, therefore, the channel selecting or control voltage is increased by about 31.2 mV. at every period T. Accordingly, when the coarse up-sweep switch 31CU is closed, the resulting rates of change of the channel selecting or control voltage applied to tuner 100 and of the resulting receiving frequency, both in respect to time, are four times the corresponding rates of change for the case when fine up-sweep switch 31FU is closed, and once again the rate of change of the receiving frequency in respect to time is substantially uniform over the low-, mid- and high-frequency regions.

Of course, if the fine down-sweep switch 31FD or the coarse down-sweep switch 31CD is closed in the programming mode of the apparatus, the resulting fine sweep pulses $P_F$ from generator 130F or coarse sweep pulses $P_C$ from generator 130C form the down-sweep pulses $P_D$ which are counted-down by counter 40, and the channel identifying code $B_1,B_2$---$B_{14}$ from counter 40 is changed in the downward direction. As the code $B_1,B_2$---$B_{14}$ is changed in the downward direction; for example, to correspond to receiving frequencies in the high-, mid-, and then low-frequency regions, the period of the down-sweep pulses $P_D$ being down-counted is changed in response to the changed states of the bits $B_{13}$ and $B_{14}$. Therefore, when decreasing the receiving frequency in the programming mode of the apparatus, the rate of change of the receiving frequency in respect to time is again substantially uniform over the entire range of the receiving frequencies.

In view of the above, the programming of memory 50 in the apparatus according to this invention can be easily and relatively quickly achieved.

Although the above described embodiment of the invention employs the two upper bits $B_{13}$ and $B_{14}$ of the channel identifying codes $B_1,B_2$---$B_{14}$ for changing the period of the sweep pulses, in stages, and thereby achieving a substantially uniform rate of change of the receiving frequency in respect to time, other means may be employed for achieving that result. For example, the frequency of the output of intermediate frequency amplifier 110 may be discriminated, and the resulting discriminated output may then control or vary the period of the sweep pulses being counted-up or counted-down by counter 40 so as to achieve the uniform rate of change of the receiving frequency in respect to time for the full range of receiving frequencies.

Although an illustrative embodiment of the invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:

1. A channel selecting apparatus for a television receiver having a tuner with a voltage-controlled, variable reactance device as its tuning element, and in which said tuning element has a non-linear relation between its control voltage and the resulting tuned frequency so that, in different ranges of said control voltage, a predetermined change in said control voltage causes relatively large and small changes, respectively, in said tuned frequency; said channel selecting apparatus comprising sweep pulse generating means operable for producing sweep pulses, counting means for counting said sweep pulses and producing progressively changing binary codes corresponding to the changing counts of said counting means and which represent respective control voltages for said variable reactance device, digital-to-analog converting means receiving said binary codes and converting the same into the respective control voltages for said variable reactance device, and means for automatically varying the repetition rate of said sweep pulses to be higher for the one of said ranges of the control voltage in which said predetermined change in the control voltages causes a relatively small change in the tuned frequency than for another of said ranges in which said predetermined change in the control voltage causes a relatively large change in the tuned frequency.

2. A channel selecting apparatus for a television receiver having a tuner with a voltage-controlled, variable reactance device as its tuning element, and in which said tuning element has a non-linear relation between its control voltage and the resulting tuned frequency so that, in different ranges of said control voltage, a predetermined change in said control voltage causes relatively large and small changes, respectively, in said tuned frequency; said channel selecting apparatus comprising sweep pulse generating means operable for producing sweep pulses, counting means for counting said sweep pulses and producing progressively changing binary codes corresponding to the changing counts of said counting means and which represent respective control voltages for said variable reactance device, digital-to-analog converting means receiving said binary codes and converting the same into the respective control voltages for said variable reactance device, and means for varying the repetition rate of said sweep pulses in response to changes in said binary codes so that said repetition rate is higher for the one of said ranges of the control voltage in which said predetermined change in the control voltage causes a relatively small change in the tuned frequency than for another of said ranges in which said predetermined change in the control voltage causes a relatively large change in the tuned frequency.

3. A channel selecting apparatus according to claim 2; further comprising memory means having a plurality of addresses therein, addressing means for selectively activating each of said addresses in said memory means, and memory control means for selectively establishing a programming mode in which a selected one of said binary codes from said counting means identifying a respective channel is written at an address in said memory means which is selectively activated by said addressing means, and a channel selecting mode in which the binary code previously written at an address in said memory means selectively activated by said addressing means is read out from said memory means; and in which said digital-to-analog converting means receives said binary codes produced by said counting means in said programming mode and further receives the selected binary code read out from said memory means in said channel selecting mode.

4. A channel selecting apparatus according to claim 3; in which each of said addresses of the memory means is further adapted to store a respective band identifying code to be read out of said memory means to said tuner upon the read out of the channel identifying binary code from the respective address; and further comprising means for writing a selected band identifying code at each said address of said memory means during said writing of a channel identifying binary code at such address.

5. A channel selecting apparatus according to claim 3; in which said digital-to-analog converting means includes pulse-width modulator means receiving said binary codes and being operative to produce a chain of pulses at a predetermined repetition rate with the width of each of said pulses being dependent on the binary code then being received, and low-pass filter means receiving said chain of pulses to provide a respective control voltage for said variable reactance device in dependence on said width of the pulses.

6. A channel selecting apparatus according to claim 5; further comprising means for producing a circulating code with said predetermined repetition rate; and in which said pulse-width modulator means also receives said circulating code and determines said pulse width in dependence on the absence of coincidence between said circulating code and said binary code then being received by said pulse width modulator means.

7. A channel selecting apparatus according to claim 6; in which said circulating code is comprised of a plurality of pulses having different respective periods; and in which said means for varying the period of the sweep pulses includes decoding means receiving upper bits of each said binary code from said counting means for providing a decoded signal indicating the range of the tuned frequency to which the respective binary code corresponds, and means controlled by said decoded signal for selectively passing, as said sweep pulses, one of said pulses of the circulating code having its respective period related to said decoded signal.

8. A channel selecting apparatus according to claim 6; in which said sweep pulse generating means is operable by bits of said circulating code.

9. A channel selecting apparatus according to claim 8; in which said sweep pulse generating means includes selectively operable means for producing said sweep pulses to be counted up by said counting means and for producing said sweep pulses to be counted down by said counting means, respectively.

10. A channel selecting apparatus according to claim 9; in which said sweep pulse generating means further includes selectively operable means for generating said sweep pulses with a relatively short period and for generating said sweep pulses with a relatively long period, respectively, so that said counting means effects relatively fast and slow changes in said binary codes when counting said sweep pulses with said relatively short and long periods, respectively.

11. A channel selecting apparatus for a television receiving having a tuner with a voltage-controlled, variable reactance device as its tuning element, and in which said tuning element has a non-linear relation between its control voltage and the resulting receiving frequency; said channel selecting apparatus comprising sweep pulse generating means including a source of pulses having different respective periods, counting means for counting said sweep pulses and producing progressively changing binary codes corresponding to the changing counts of said counting means and which represent respective control voltages for said variable reactance device, digital-to-analog converting means receiving said binary codes and converting the same into the respective control voltages for said variable reactance device, and means for varying the period of the sweep pulses including decoding means receiving upper bits of each said binary code from said counting means for providing a decoded signal indicating a range of the tuned frequency to which the respective binary code corresponds, and means controlled by said decoded signal for selectively passing, as said sweep pulses, one of said pulses from said source which has its respective period related to said decoded signal.

12. A channel selecting apparatus according to claim 11; in which said decoding means includes a plurality of AND circuits each receiving the two upper bits of each of said binary codes so that each of said AND circuits provides an output constituting said decoded signal only when said two upper bits have respective predetermined states; and in which said means for selectively passing one of said pulses from the source includes a plurality of NAND circuits each receiving respective pulses from said source and the output from a respective one of said AND circuits.

* * * * *